(12) United States Patent
Griebenow et al.

(10) Patent No.: US 8,615,145 B2
(45) Date of Patent: Dec. 24, 2013

(54) SEMICONDUCTOR DEVICE COMPRISING A BURIED WAVEGUIDE FOR DEVICE INTERNAL OPTICAL COMMUNICATION

(75) Inventors: Uwe Griebenow, Markkleeberg (DE); Kai Frohberg, Niederau (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 497 days.

(21) Appl. No.: 12/886,678

(22) Filed: Sep. 21, 2010

(65) Prior Publication Data

US 2011/0076028 A1 Mar. 31, 2011

(30) Foreign Application Priority Data

Sep. 30, 2009 (DE) .......................... 10 2009 047 872

(51) Int. Cl.
*G02B 6/12* (2006.01)
(52) U.S. Cl.
USPC ............................................................ 385/14
(58) Field of Classification Search
USPC .................................. 385/14, 37, 31, 129–132
See application file for complete search history.

(56) References Cited

U.S. PATENT DOCUMENTS

| | | | |
|---|---|---|---|
| 4,966,430 A | 10/1990 | Weidel | 350/96.11 |
| 5,054,870 A | 10/1991 | Loesch et al. | 385/14 |
| 7,574,090 B2 | 8/2009 | Shimooka | 385/129 |
| 2003/0034508 A1* | 2/2003 | Pandya | 257/288 |
| 2008/0181557 A1 | 7/2008 | Wang et al. | 385/14 |
| 2009/0208164 A1 | 8/2009 | Kim et al. | 385/14 |

FOREIGN PATENT DOCUMENTS

| | | | | |
|---|---|---|---|---|
| DE | 3834335 A1 | 4/1990 | | H01L 27/14 |
| DE | 3910710 A1 | 10/1990 | | H01L 23/50 |

OTHER PUBLICATIONS

Translation of Official Communication from German Patent Office for German Patent Application No. 10 2009 047 872.8 dated Jan. 30, 2012.

* cited by examiner

*Primary Examiner* — Charlie Peng
*Assistant Examiner* — Mary El Shammaa
(74) *Attorney, Agent, or Firm* — Williams, Morgan & Amerson, P.C.

(57) ABSTRACT

In an integrated circuit device, such as a microprocessor, a device internal optical communication system is provided in order to enhance signal transfer capabilities while relaxing overall thermal conditions. Furthermore, the device internal optical data or signal transfer capabilities may result in superior operating speed and a high degree of design flexibility. The optical communication system may be applied as a chip internal system in single chip systems or as an inter-chip optical system in three-dimensional chip configurations provided in a single package.

19 Claims, 8 Drawing Sheets

SEMICONDUCTOR DEVICE COMPRISING A BURIED WAVEGUIDE FOR DEVICE INTERNAL OPTICAL COMMUNICATION

BACKGROUND OF THE INVENTION

1. Field of the Invention

The present disclosure generally relates to the field of fabricating integrated circuits, and, more particularly, to interconnect structures for signal exchange in complex integrated circuits.

2. Description of the Related Art

In modern integrated circuits, a very high number of individual circuit elements, such as field effect transistors, in the form of CMOS, NMOS and PMOS elements, resistors, capacitors and the like, are formed on a single chip area. Typically, feature sizes of these circuit elements are continuously decreased with the introduction of every new circuit generation, to provide currently available integrated circuits formed by volume production techniques with critical dimensions of 50 nm or less and having an improved degree of performance in terms of speed and/or power consumption. A reduction in size of transistors is an important aspect in steadily improving device performance of complex integrated circuits, such as CPUs. The reduction in size is commonly associated with an increased switching speed, thereby enhancing signal processing performance at transistor level.

In addition to the large number of transistor elements, a plurality of passive circuit elements, such as capacitors, resistors, interconnect structures and the like, are typically formed in integrated circuits as required by the basic circuit layout. Due to the decreased dimensions of the active circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

Although, in highly complex integrated circuits, transistor elements are the dominant circuit elements which substantially determine the overall performance of these devices, other components such as capacitors and resistors and in particular a complex interconnect system or metallization system may be required, wherein the size of these passive circuit elements may also have to be adjusted with respect to the scaling of the transistor elements in order to not unduly consume valuable chip area.

Typically, as the number of circuit elements, such as transistors and the like, per unit area may increase in the device level of a corresponding semiconductor device, the number of electrical connections associated with the circuit elements in the device level may also be increased, typically even in an over-proportional manner, thereby requiring complex interconnect structures which may be provided in the form of metallization systems including a plurality of stacked metallization layers. In these metallization layers, metal lines, providing the inner-level electrical connection, and vias, providing intra-level connections, may be formed on the basis of highly conductive metals, such as copper and the like, in combination with appropriate dielectric materials, so as to reduce the parasitic RC (resistive capacitive) time constants, since, in sophisticated semiconductor devices, typically, signal propagation delay may be substantially restricted by the metallization system rather than the transistor elements in the device level. However, expanding the metallization system in the height dimension so as to provide the desired density of interconnect structures may be restricted by the parasitic RC time constants, the limitations imposed by the material characteristics of sophisticated low-k dielectrics and the heat dissipation capability. That is, typically, a reduced dielectric constant is associated with reduced mechanical stability of these dielectric materials, thereby also restricting the number of metallization layers that may be stacked on top of each other in view of yield losses during the various fabrication steps and the reduced reliability during operation of the semiconductor device. Moreover, the increasing current density in the metal line, in combination with increased waste heat produced in the device level, may require superior heat conductivity, which may not be compatible with a high packing density of metal lines and a reduced dielectric constant of the dielectric materials of the metallization system.

Consequently, in addition to any restrictions for the complexity of integrated circuits, such as microprocessors and the like, caused by the mechanical and chemical characteristics of low-k dielectric materials, the restricted heat dissipation capabilities of complex metallization systems may also require a corresponding adaptation of the overall complexity of the circuit layout. In view of this situation, it has been proposed to enhance the heat dissipation capabilities and thus increase the thermal budget of complex semiconductor devices by providing three-dimensional chip configurations, in which stacked semiconductor chips may be connected within a single package, thereby increasing the volume density of circuit elements for a given package size, while at the same time the thermal conditions may be relaxed to a certain degree compared to a substantially "two-dimensional" chip configuration. Although three-dimensional chip configurations may enable a further increase of the complexity compared to a single integrated circuit formed in a single package, a further increase of the packing density of the individual semiconductor chips may nevertheless result in sophisticated thermal conditions within the three-dimensional chip stack, which may, therefore, also require sophisticated heat management systems. Moreover, in three-dimensional chip configurations, as well as in metallization systems of one-chip semiconductor devices, the signal propagation delay for communication between the various circuit portions of complex integrated circuits may increasingly represent a permanent limiting factor for enhancing performance of the entire integrated circuit. For example, in complex circuits, such as microprocessors and the like, circuit portions may have to communicate with each other on the basis of signal lines provided in the metallization system, thereby requiring sophisticated dielectric materials and conductive metals, while, nevertheless, extremely high current densities may have to be applied in the individual metal lines and vias. Consequently, upon increasing, for instance, data transfer in a complex microprocessor system provided as a single chip configuration, the signal routing may become increasingly complex, thereby additionally contributing to increased heat generation in the metallization system and signal propagation delay. In three-dimensional chip configurations, the signal propagation delay is even further increased, since the entire length of signal paths may increase due to the required inter-chip signal communication.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides integrated circuit devices, semiconductor devices and methods for operating the same in which signal exchange, i.e., communication between various circuit portions, may be accomplished, at least partially, on the basis of optical signals in order to reduce the local heat generation in complex integrated circuits and to provide superior data or signal transfer speed. For example, optical signals within a complex circuit, such as a microprocessor, may be converted into an optical signal and may be transmitted via an appropriate waveguide system, which may thus convey information on the basis of a mechanism that requires a significantly reduced amount of energy along the optical transmission path, compared to a conductive line of equal bandwidth in a metallization system, providing substantially the same signal transmission performance. On the other hand, the conversion of an electrical signal into an optical signal and vice versa, may be performed at the corresponding end areas of the optical transmission path, thereby efficiently distributing any waste heat generated by the respective opto-electronic components used for performing the conversion process. Furthermore, if desired, a plurality of speed critical signals, for instance as encountered in a data transfer of a complex integrated circuit, may be transmitted via a "long" distance within a single chip, for instance, by circumventing critical areas of a metallization system and the like, or within a complex three-dimensional chip configuration, without causing significant signal propagation delay, which may thus provide superior design flexibility for single-chip configurations and also for three-dimensional stacked configurations. In some illustrative aspects disclosed herein, at least the optical signal path or waveguide may be provided on the basis of well-established materials and process techniques, which may also be used during the formation of circuit elements, such as field effect transistors and the like, thereby not unduly contributing to an increased process complexity. On the other hand, any opto-electronic components, such as laser elements, photodiodes, phototransistors and the like, may be incorporated into the device level of the integrated circuit device or may be provided in or above a metallization system in the form of a separate semiconductor device, as required.

One illustrative integrated circuit device disclosed herein comprises a first plurality of circuit elements formed in and above a first semiconductor region. Moreover, a second plurality of circuit elements is formed in and above a second semiconductor region. The integrated circuit further comprises an optical waveguide having a first end and a second end. Additionally, the integrated circuit comprises a first opto-electronic component electrically coupled to the first plurality of circuit elements so as to electrically communicate with at least one circuit element of the first plurality of circuit elements, wherein the first opto-electronic component is optically coupled to the first end of the optical waveguide. Furthermore, the integrated circuit device comprises a second opto-electronic component electrically coupled to the second plurality of circuit elements so as to electrically communicate with at least one circuit element of the second plurality of circuit elements, wherein the second opto-electronic component is optically coupled to the second end of the optical waveguide.

One illustrative microprocessor device disclosed herein comprises a first circuit element formed in and above a semiconductor layer, wherein the first circuit element is configured to generate a signal. A second circuit element is formed in and above the semiconductor layer and is configured to receive the signal. Moreover, the microprocessor device comprises an optical communication system configured to receive the signal from the first circuit element and to provide the signal to the second circuit element via an optical wave guide.

One illustrative method disclosed herein relates to operating an integrated circuit device. The method comprises generating a first electrical signal in a first circuit portion of the integrated circuit device. The method further comprises converting the first electrical signal into an optical signal by using a device internal first opto-electronic component. The method additionally comprises transmitting the optical signal in a device internal waveguide and converting the optical signal into a second electrical signal by using a second device internal opto-electronic component. The method further comprises operating a second circuit portion of the integrated circuit on the basis of the second electrical signal.

BRIEF DESCRIPTION OF THE DRAWINGS

The disclosure may be understood by reference to the following description taken in conjunction with the accompanying drawings, in which like reference numerals identify like elements, and in which.

Figure 1A:
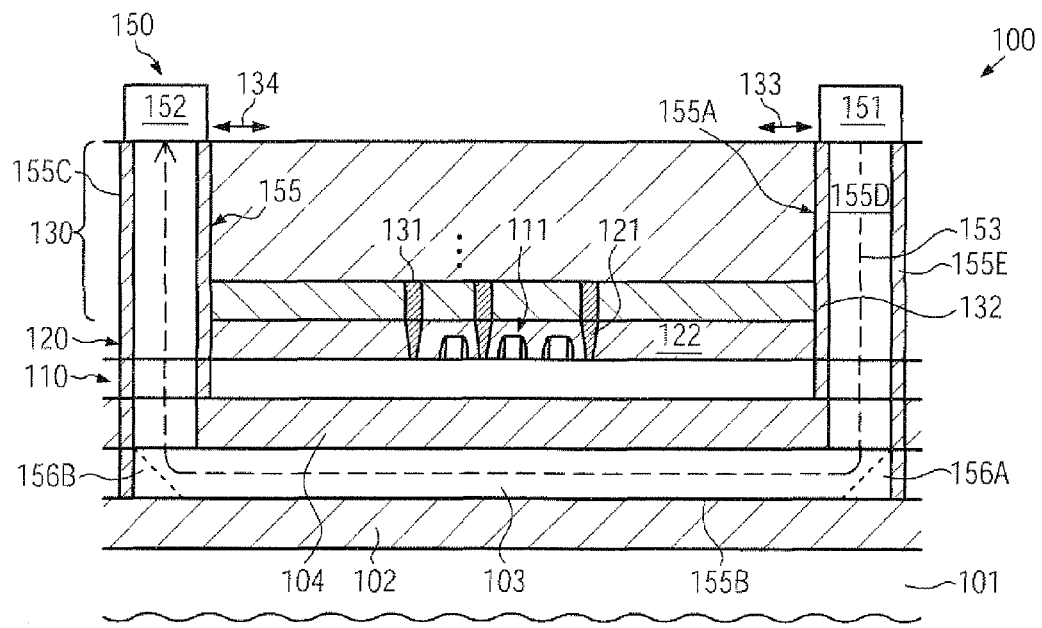
FIG. 1a schematically illustrates a cross-sectional view of an integrated circuit device, such as a microprocessor and the like, in which communication between circuit elements or circuit potions may be accomplished, at least in part, by an optical communication system, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides integrated circuit devices which, in some illustrative embodiments, may be provided in the form of single chip configurations, while, in other embodiments, three-dimensional or stacked device configurations may be used, wherein a part of the device internal signal exchange may be accomplished on the basis of optical signal processing. For this purpose, device internal opto-electronic components may be provided, which are to be understood hereinafter as circuit elements that are configured to convert an electrical signal into an optical signal or to convert an optical signal into an electrical signal, for instance on the basis of light emitting diodes, laser diodes, photodiodes, phototransistors and the like. It should be understood that a "device internal" circuit element is to be understood as any circuit element that is formed in a semiconductor material mechanically connected to a substrate or chip or to a plurality of chips, which may mechanically and electrically represent a single device unit that may be packaged into a single package, thereby forming an integrated circuit device. Moreover, a device internal circuit element may also be understood as a semiconductor component which may be attached to a substrate so as to be electrically, optically, mechanically coupled to other circuit elements so as to form a desired functional unit that may be incorporated into an appropriate package. For this purpose, many types of opto-electronic components, such as edge-emitting laser diodes, vertical-cavity surface-emitting lasers (VCSEL), photodiodes and the like, may be formed on the basis of appropriate semiconductor materials and may be subsequently attached to a complex semiconductor device in order to form a functional unit to be incorporated into a common package. Consequently, by providing optical signal exchange capabilities in a complex integrated circuit, such as a microprocessor, superior signal propagation characteristics may be achieved, in combination with an overall reduced operating temperature of the device, while, at the same time, circuit portions or individual circuit elements of different supply potential may be operatively connected without any intermediate voltage converter and the like. In some illustrative embodiments disclosed herein, a chip internal optical communication path may be provided in the form of a waveguide having a buried waveguide portion, thereby obtaining a very space-efficient configuration without contributing to signal propagation delay.

FIG. 1a schematically illustrates a cross-sectional view of an integrated circuit device 100 in an advanced manufacturing stage. The device 100 may comprise a substrate 101, such as a semiconductor substrate, an isolating substrate and the like. Furthermore, a semiconductor layer 110, such as a silicon-based semiconductor material, a silicon/germanium material or any other appropriate semiconductor material, may be provided above the substrate 101 and may act as a base material for forming therein and thereabove circuit elements 111, for instance field effect transistor, resistors, capacitors and the like. The plurality of circuit elements 111 may represent any appropriate circuit or circuit portion of the device 100 and, in some illustrative embodiments, the circuit elements 111 may form one or more circuit portions of a microprocessor, which may include one or more processor cores, memory areas, in the form of static RAM areas, and the like. Furthermore, as previously discussed, the device 100 may comprise a metallization system 130, which may include a plurality of metal lines 131 and vias (not shown) in order to establish a plurality of electrical connections in accordance with the overall circuit layout of the device 100. For example, the metallization system 130 may comprise a plurality of stacked metallization layers, wherein, for convenience, a single metallization layer 132 is illustrated in FIG. 1A in more detail. For example, the metallization layer 132 may comprise the metal lines 131 in combination with any appropriate dielectric material, which may provide the required electrical performance of the metallization system 130. Furthermore, in the embodiment shown, a contact level 120 may be provided and may act as an interface between the metallization system 130 and the plurality of circuit elements 111 formed in and above the semiconductor layer 110. For example, the contact level may comprise an appropriate dielectric material 122 and contact elements 121 comprised of any appropriate conductive materials. In the embodiment shown, the metallization system 130 may thus provide a part of the required connections for exchanging signals between individual circuit elements or circuit portions of the circuit elements 111 and may also represent an interface for operatively coupling the circuit elements 111 with an optical communication system 150. The optical communication system 150 may comprise a first opto-electronic component 151, which may be configured to receive an electrical signal, for instance, via the metallization system 130 as indicated by 133 and to convert the electrical signal 133 into an optical signal 153. It is to be noted that, in this application, an optical signal is to be understood as a modulated electromagnetic radiation with a wavelength ranging from the infrared portion of the spectrum to the visible portion of the spectrum and into the near ultraviolet range. Thus, the opto-electronic component 151 may represent any semiconductor-based device that may provide a modulated optical beam, such as a pulsed beam and the like, with a desired wavelength range. For instance, the component 151 may represent a light-emitting diode, a laser diode and the like.

Moreover, the optical communication system 150 may comprise a second opto-electronic component 152 that is configured to receive the optical signal 153 and convert it into an electrical signal, as indicated by 134, which may thus be supplied to one or more of the circuit elements 111 via the metallization system 130. For instance, the opto-electronic component 152 may represent a photodiode, a phototransistor, a light-sensitive resistive structure, a photo-electric element and the like. Moreover, the optical communication system 150 may comprise an optical waveguide 155, which comprises a first waveguide branch 155A, a second waveguide branch 155B and a third waveguide branch 155C. The optical waveguide 155 may have any appropriate configuration in order to allow propagation of the optical signal 153. For example, the waveguide 155 may comprise a core comprised of any appropriate material that enables the transmission of the optical signal 153 without undue absorption. For example, the core material 155D may be provided in the form of a semiconductor material, such as silicon and the like. Furthermore, the waveguide 155 may comprise a "cladding" 155E, which may represent any appropriate material having an index of refraction that is less than an index of refraction of the core material 155D, thereby providing the required optical behavior, i.e., for a substantially total reflectivity for the components of the optical signal 153 incident on an interface formed by the core material 155D and the cladding 155E within a certain range of angles of incidence. Moreover, the optical waveguide 155 may comprise appropriate deflecting areas 156A, 156B so as to optically couple the branch 155A with the branch 155B, which may also be referred to as a buried waveguide portion, and finally to connect the branch 155B with the branch 155C. The deflecting areas 156A, 156B may be provided in the form of "mirror-like" components, Bragg gratings and the like, as will be described later on in more detail.

It should be appreciated that, in other illustrative embodiments (not shown), the optical waveguide 155 may have any appropriate configuration and complexity as required for providing the desired optical communication capabilities. For instance, the optical communication system 150 may represent a bi-directional communication system so as to exchange the optical signal 153 between the opto-electronic components 151 and 152 in any direction. For this purpose, each of the components 151, 152 may act as a receiver/transmitter for the signal 153. Furthermore, the components 151, 152 may be configured to process the signal 153 so as to include a specific band width so that a plurality of electrical signals 133, 134 may be simultaneously transferred via the optical communication system 150. Furthermore, the optical waveguide 155 may have any appropriate configuration, i.e., more or less optical waveguide branches as shown in FIG. 1a may be provided in accordance with the overall device requirements. Consequently, the optical communication system 150 may result in a significant reduction in complexity of the metallization system 130 for a given required signal interaction capability for the circuit element 111 compared to a conventional integrated circuit device without any optical device internal communication capabilities.

The integrated circuit device 100 as illustrated in FIG. 1a may be formed on the basis of any appropriate manufacturing techniques, as will also be described later on in more detail. For example, the buried waveguide branch 155B may be formed on the basis of a specifically-designed sequence of material layers 102, 103 and 104. For example, the metallization layers 102, 104 which may act as cladding 155E of the waveguide branch 155B may be provided in the form of buried insulating materials, such as silicon dioxide and the like, while the material layer 103 may represent an appropriate semiconductor material, such as silicon and the like. Consequently, a portion of the layer 103 may act as the core material 155D of the branch 155B. Furthermore, at least a portion of the branches 155A, 155C may be formed on the basis of well-established lithography, etch and deposition techniques, as will be described later on in more detail. Thereafter, the circuit elements 111 may be formed in and above the semiconductor layer 110 in accordance with any appropriate process techniques, followed by the formation of the contact level 120 and the metallization system 130. Thereafter, the branches 155A, 155C may be completed by appropriate process techniques, including the patterning of metallization system 130 by anisotropic etch techniques and refilling the resulting openings with the cladding material 153 and the core material 155D. For instance, corresponding openings may be formed through the dielectric materials of the individual metallization layers of the system 130 and the cladding material may be deposited and may be subsequently anisotropically etched so as to obtain the cladding 153 as illustrated in FIG. 1a. Thereafter, the core material 155D may be filled in by any appropriate deposition technique and any excess material may be removed by etch techniques, chemical mechanical polishing (CMP) and the like. In other cases, the waveguide branches 155A, 155C may be formed on the basis of several parts, for instance for each individual metallization layer of the system 130, in order to obtain less complex process conditions for patterning corresponding openings and refilling the same with the cladding material 155E and the core material 155D. At any appropriate stage, the opto-electronic components 151, 152 may be attached to the metallization system 130, for instance at any intermediate manufacturing stage, if considered appropriate, while, in other cases, the metallization system 130 may be substantially completed and may require the provision of additional contact pads or contact elements for connecting to a package in a later manufacturing stage. It should be appreciated that the device 100 may be provided above the substrate 101 along with a plurality of other integrated circuit devices, when the components 151, 152 may be applied concurrently to a plurality of identical devices 100, for instance, by any appropriate bond techniques and the like. In other cases, the device 100 may already represent an isolated device separated from other devices and may be subjected to additional process steps for incorporating the device 100 into an appropriate package while at the same time providing electrical connections between the metallization system 130 and a metallization system of the package (not shown), as is well known in the art. For example, for this purpose, wire bond techniques, techniques for directly connecting the metallization system 130 with contact pads of the package and the like may be applied. In other illustrative embodiments (not shown), the optical communication system 150 may also act as an interface for connecting to the periphery of the integrated circuit device 100, for instance via an appropriate optical interface provided in the package that is to accommodate the device 100 in a final manufacturing stage.

During operation of the integrated circuit device 100 after packaging the device 100 as shown in FIG. 1a, at least one of the circuit elements 111 may generate an electrical signal, for instance, a digital signal as may typically be used in a microprocessor device for data transfer. The corresponding signal may be supplied to the opto-electronic component 151, for instance as the signal 133, and may be converted into the optical signal 153, which in turn may be transmitted to the opto-electronics component 152, thereby "circumventing" the metallization system 130, while at the same time providing superior signal propagation characteristics. The opto-electronic component 153, in turn, may convert the optical signal 153 into the electrical signal 134, which may be supplied to one or more of the circuit elements 111. It should be appreciated that the spatial arrangement of the circuit elements 111 is of an illustrative nature only. For example, by means of the optical communication system 150, any circuit portions, irrespective of the spatial relationship to each other, may be efficiently operatively connected to each other on the basis of the waveguide 155, without consuming valuable chip area, while at the same time providing the superior signal propagation characteristics. Moreover, as previously discussed, by means of optical signal transmission, a required bandwidth for the device internal communication may be provided on the basis of a significantly lesser overall power consumption compared to a "pure" electrical communication system, thereby also reducing the overall power consumption of the integrated circuit device 100. Furthermore, since critical circuit portions may be positioned without restrictions with respect to signal propagation delay, the heat generation in the device level 110 may be distributed more efficiently across the entire available chip area, thereby also providing less critical temperature conditions locally within the integrated circuit 100, thereby also significantly relaxing the overall thermal conditions of the device 100.

Figure 1B:
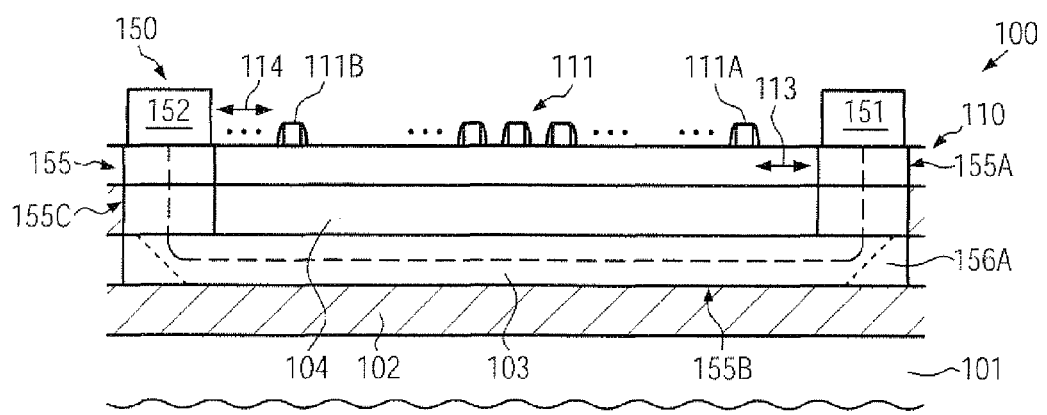
FIG. 1b schematically illustrates the integrated circuit device, according to still further illustrative embodiments, in which at least one opto-electronic component, such as a laser diode, a light emitting diode, a photodiode and the like, may be formed in the device level of circuit elements.

FIG. 1b schematically illustrates the integrated circuit device 100 according to further illustrative embodiments in which the optical communication system 150, or at least a portion thereof, depending on the overall complexity, may be provided on the basis of electro-optical components in and above the device level 110. For example, as illustrated, the components 151 and 152 may be formed in and above the semiconductor layer 110, if the corresponding material systems are compatible with the requirements for optical signal processing of the components 151 and 152. In other cases, one of the components 151, 152 may be provided in or above a metallization system, as is, for instance, illustrated in FIG. 1a, for both of the components 151 and 152. In the embodiment shown in FIG. 1b, the component 151 may be connected to one of the circuit elements 111, such as a circuit element 111A, via an electrical signal 113, which may be communicated through the component 151 within the semiconductor layer 110 or on the basis of any interconnect structure, as required. Similarly, the opto-electronic component 152 may be connected to another one of the circuit elements 111, such as a circuit element 111B, by means of an electrical signal 114. With respect to the optical waveguide 155, the same criterion may apply as previously explained with reference to FIG. 1a. For instance, the waveguide 155 may comprise a core material of increased optical thickness, such as silicon, which is trans-parent for a wavelength of approximately 1 µm, with an index of refraction of approximately 4. On the other hand, silicon dioxide may be used as a cladding having a reduced index of refraction for the above-specified wavelength range. It should be appreciated, however, that, if required, the optical characteristics of the various waveguide branches 155A, 155B, 155C may be appropriately adapted by incorporating a species, such as oxygen, nitrogen and the like, as is well known, for instance, for anti-reflective coating (ARC) materials and the like.

Figure 1C:
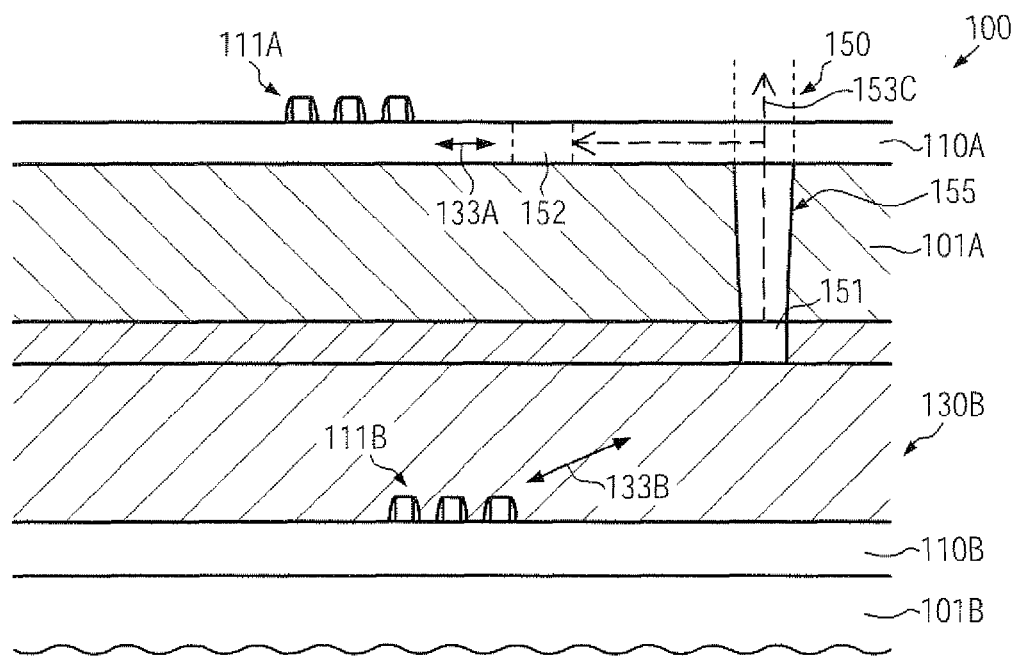
FIG. 1c schematically illustrates a cross-sectional view of the integrated circuit device, in which a stacked configuration may be used in combination with an inter-level and/or an intra-level optical communication system, according to still further illustrative embodiments.

FIG. 1c schematically illustrates a cross-sectional view of the integrated circuit device 100 according to further illustrative embodiments in which a "three-dimensional" or stacked configuration may be applied for enhancing overall functionality of the device 100. For example, as illustrated, a first substrate 101B may be provided and may have formed thereabove a first semiconductor layer or level 110B, in and above which circuit elements 111B may be provided so as to represent a specific circuit portion of the device 100. Furthermore, a metallization system 130B, which may have any appropriate configuration, may be provided so as to electrically interconnect the circuit elements 111B and also to connect one or more of the circuit elements 111B with the optical communication system 150, as indicated by electrical signals 133B. For example, as illustrated in FIG. 1c, the opto-electronic component 151 may be operatively connected to the circuit elements 111B via the electrical signals 133B, which may represent bi-directional signals, when the component 151 may be configured to convert electrical signals into optical signals and to convert optical signals into electrical signals. Furthermore, the integrated circuit device 100 may comprise a second substrate 101A formed above the metallization system 130B, followed by a second device level or semiconductor layer 110A, in and above which circuit elements 111A may be formed so as to represent a further circuit portion of the device 100. It should be appreciated that, if required, the metallization system 130B may be operatively connected to the device level 110A by additional electrical connections (not shown), such as through-hole vias and the like, which may extend through the substrate 101A and may connect to respective contact areas of the metallization system 130B. In the embodiment shown in FIG. 1c, the optical communication system 150 may comprise the opto-electronic component 152 either in or above the layer 110A and electrically connected to the circuit elements 111A by means of electrical signals 133A, which may also represent bi-directional signals, if required. Furthermore, the optical communication system 150 may also connect to further portions of the device 100, as indicated by 153C, depending on the overall communication requirements of the device 100. Consequently, by means of the optical communication system 150, the circuit portion represented by the elements 111A may be efficiently connected to the circuit portion represented by the elements 111B, for instance for providing an efficient data transfer and the like. Furthermore, if required, additional electrical connections may be established between these two circuit portions. Consequently, upon providing the optical communication system 150 for a device internal signal exchange in a three-dimensional or stacked configuration, the thermal conditions may be significantly relaxed for the same reasons as pointed out above. Moreover, heat critical circuit portions may be efficiently distributed cross the entire three-dimensional stack of the device 100, since a fast signal transfer, even along significant vertical distances, may be established on the basis of the communication system 150. Moreover, since the waveguide 155, and in particular the branch connecting the device level 110A with the metallization system 130B, may be provided on the basis of materials such as silicon, silicon dioxide, silicon nitride, or any other semiconductor components, dielectric materials and the like, a high degree of flexibility in scheduling the manufacturing flow may be achieved, as the waveguide 155 may be provided prior to performing high-temperature processes as are typically required for forming the circuit elements 111A above the substrate 101A. That is, respective waveguide branches may be formed in the substrate 101A prior to actually forming the circuit elements 111A substantially without negatively affecting performance of the waveguide 155. Consequently, the circuit elements 111B and the metallization system 130B may be formed in accordance with any appropriate process techniques in and above the substrate 101B, while the circuit elements 111A may be formed above the substrate 101A in separate process steps, without significant interference by the presence of the waveguide 155. Thereafter, the substrate 101A may be connected with the metallization system 130B on the basis of well-established bond techniques, thereby also establishing the optical coupling between the waveguide 155 and the optical component 151, which may be formed on the metallization system 130B. It should be appreciated, however, that any other appropriate process techniques may be applied in order to mechanically connect the substrate 101A to the metallization system 130B. Similarly, in other cases, appropriate electrical and optical connections may be made in the substrate 101B and the substrates 101B, 101A may be connected to each other in order to establish a plurality of electrical and optical connections. If required, any further device levels may be added in accordance with the overall complexity of the integrated circuit device 100.

Furthermore, as discussed above with reference to FIG. 1a, a device may be incorporated in an appropriate package (not shown), which may provide electrical and, if required, optical interaction with the periphery.

With reference to FIGS. 1d-1p, illustrative embodiments will now be described in which an optical waveguide may be formed in an integrated circuit device in accordance with illustrative embodiments.

Figure 1D:
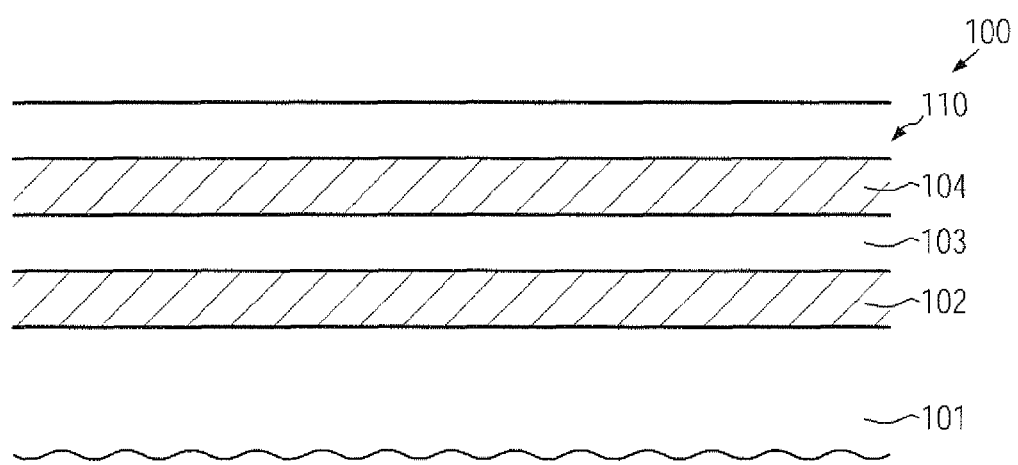
FIGS. 1d-1j schematically illustrate cross-sectional views of the integrated circuit device during various manufacturing stages in forming a buried waveguide portion, according to illustrative embodiments.

FIG. 1d schematically illustrates the device 100 in an early manufacturing stage in which the substrate 101 has formed therein or above a stack of layers for forming circuit elements and a buried waveguide portion. Thus, as illustrated, the semiconductor layer 110, for instance a silicon-based material layer, may be formed on the buried insulating layer 104, which in turn is formed on the semiconductor layer 103 that is separated from the substrate 101 by the further buried insulating layer 102, as is, for instance, also described with reference to FIG. 1a. The device 100 as illustrated in FIG. 1d may be formed on the basis of wafer bond techniques, for instance by using an SOI (silicon- or semiconductor-on-insulator) substrate to which a further substrate may be bonded having formed thereon the layers 104 and 110. Thereafter, excess material of the additional substrate may be removed, for instance by cleaning the substrate, thereby obtaining the layer 110, which may be further treated so as to obtain the required surface conditions.

Figure 1E:
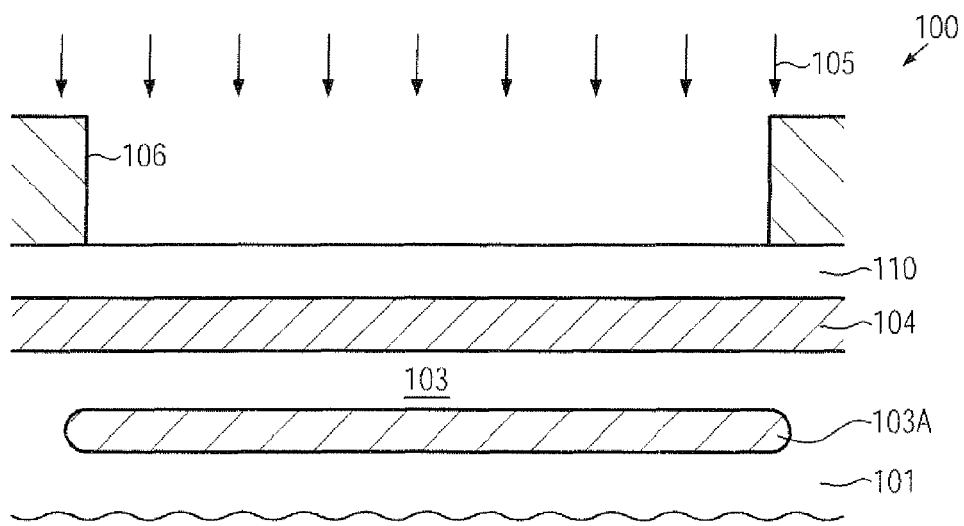

FIG. 1e schematically illustrates the device 100 according to further illustrative embodiments in which a required sequence of optically different materials may be obtained on the basis of implantation techniques, for instance, by using an SOI substrate or a bulk substrate. In the embodiment shown, the substrate 101, in combination with the buried insulating layer 104 and the semiconductor layer 110, may be provided as an SOI substrate and may be exposed to an ion implantation process 105 in order to form a buried insulating material 103A, possibly in combination with an appropriate heat treatment. For example, the implantation process 105 may be used in order to introduce an oxygen species into a silicon base material of the substrate 101. Thereafter, during a heat treatment, a silicon dioxide material may be generated, thereby forming the buried insulating material 103A. Furthermore, if desired, the material 103A may be spatially restricted by applying a mask 106, which may substantially define the lateral dimension of the buried insulating material 103A.

Figure 1F:
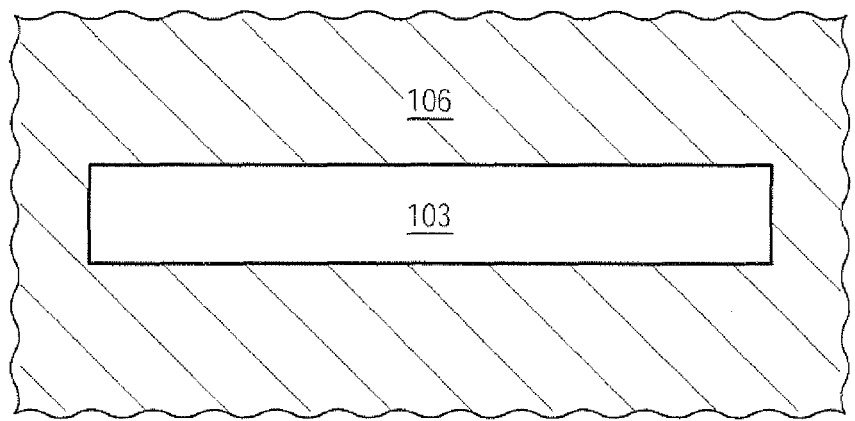

FIG. 1f schematically illustrates a top view of the device 100, wherein an opening in the mask 106 may expose the portion of the layer 110, thereby defining the lateral dimensions of the buried material 103A as shown in FIG. 1E. It should be appreciated that, due to the nature of the implantation process and due to the subsequent heat treatment, a certain degree of diffusion may take place and may thus result in slightly increased dimensions of the material 103A, compared to the dimensions as defined by the implantation mask 106.

It should be appreciated that the buried material 103A may be provided as a layer, similarly to the buried insulating layer 103 of FIG. 1d, if required. Moreover, if desired, the buried insulating layer 104 may be formed by an implantation process with a subsequent heat treatment, if considered appropriate, wherein lateral dimensions may be restricted by an implantation mask, as is explained with reference to the mask 106.

Figure 1G:
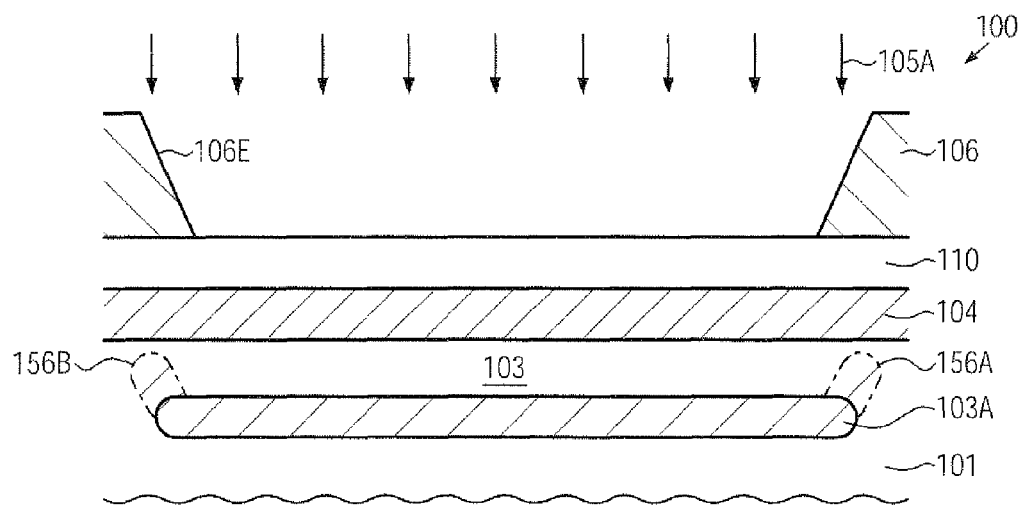

FIG. 1g schematically illustrates the device 100 according to further illustrative embodiments in which the deflecting areas 156A, 156B may be formed on the basis of an ion implantation process 105A in order to impart mirror-like characteristics to the areas 156A, 156B. In the embodiment shown, an implantation mask, such as the mask 106 as previously used, may be appropriately adapted, for instance, by eroding edges 106E so as to obtain a "variable" ion blocking effect. For instance, a material erosion process, for instance in the form of a plasma assisted etch process, may be applied so as to obtain a desired continuously decreasing in thickness of the mask 106 at the edges 106E. For this purpose, well-established recipes may be applied for resist materials or any other material, such as dielectric materials and the like. It should be appreciated that, if required, a specific implantation mask may be provided for the process 105A in order to apply specifically-designed material erosion processes for obtaining the edges 106E having the varying thickness. During the implantation process 105A, the penetration depth may also vary for a given implantation energy and implantation species, thereby obtaining the deflecting portions 156A, 156B. It should be appreciated that any appropriate implantation species may be used in order to impart the desired optical characteristics to the deflecting areas 156A, 156B. For instance, an oxygen species may be incorporated, when the reflectivity of a silicon/silicon dioxide interface upon an angle of incidence of approximately 30-60 degrees is considered appropriate. In other cases, other species may be incorporated, such as refractory metal species and the like, in order to provide a material of significantly increased optical density compared to the substrate material 101.

Figure 1H:
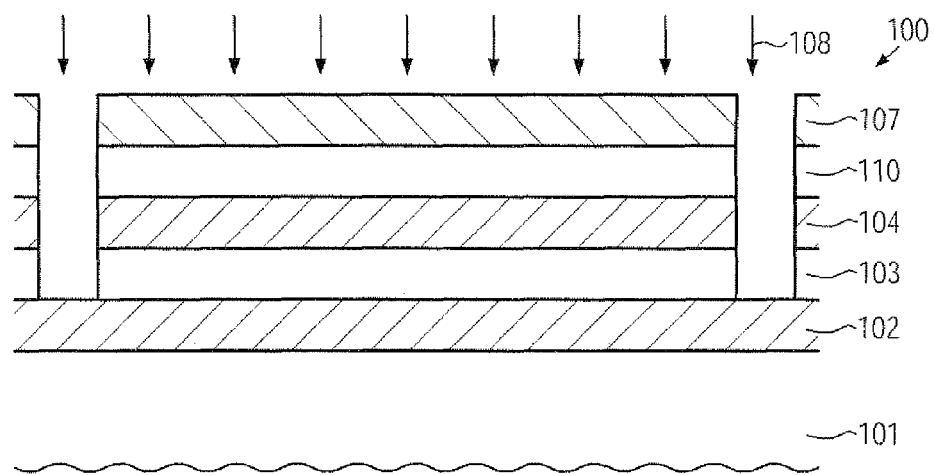

FIG. 1h schematically illustrates the semiconductor device 100 in a further advanced manufacturing stage. As illustrated, an etch mask 107, for instance a resist mask and the like, may be formed above the semiconductor layer 110 and may define the lateral size and position of a cladding material of a waveguide portion still to be formed in the layers 110, 104 and 103. Furthermore, the device 100 may be exposed to an etch sequence 108 for etching through the materials 110, 104, 103, and, if desired, through the layer 102. For this purpose, well-established anisotropic etch recipes may be applied as are available for a plurality of semiconductor materials, such as silicon, and a plurality of dielectric materials, such as silicon dioxide, silicon nitride and the like.

Figure 1I:
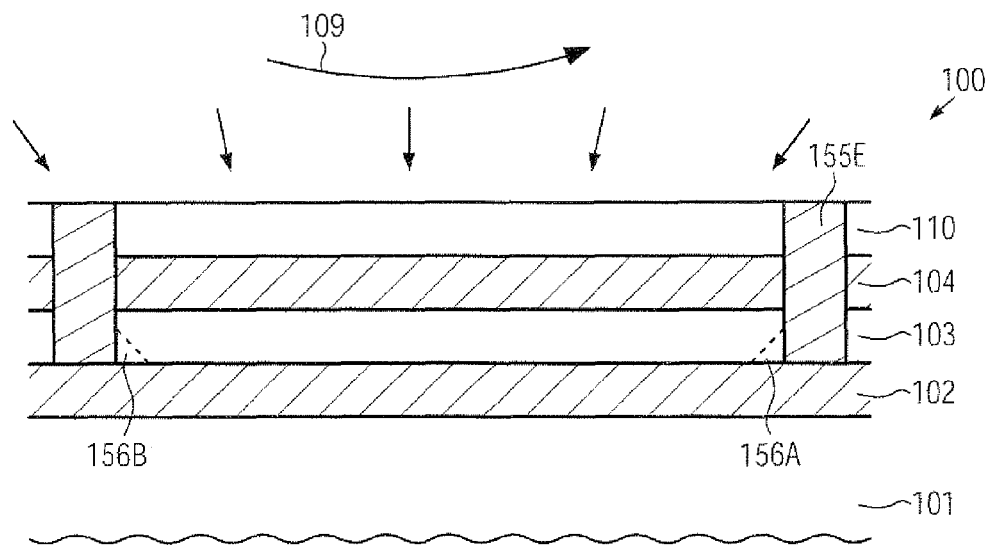

FIG. 1i schematically illustrates the device 100 after the removal of the etch mask 107 of FIG. 1h and during a process sequence 109 for depositing the cladding material 155E, for instance, in the form of silicon dioxide and the like, and for removing any excess material thereof. For example, silicon dioxide may be deposited on the basis of plasma-assisted or thermally activated chemical vapor deposition (CVD) techniques and excess material may be removed on the basis of etch techniques, CMP and the like. It should be appreciated that a stop layer (not shown) may be provided, for instance, prior to performing the etch process 108 of FIG. 1h, so that the corresponding stop material may cover the horizontal surface portions of the layer 110 upon performing, for instance, a CMP process, thereby preserving integrity of the layer 110. As indicated, the cladding material 155E may be provided such that the deflecting areas 156A, 156B may still be preserved, if provided.

Figure 1J:
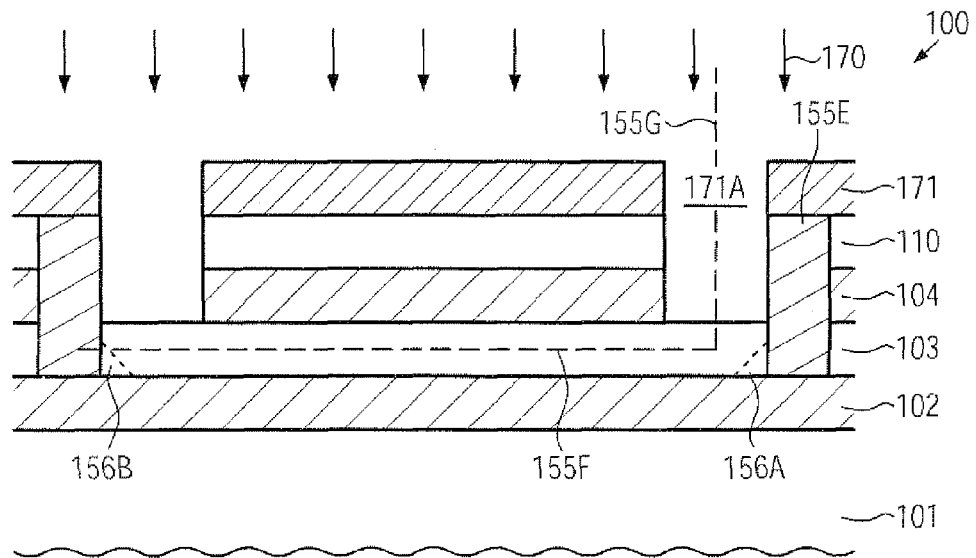

FIG. 1j schematically illustrates the device 100 in a further advanced manufacturing stage in which an etch mask 171 may be provided so as to define the lateral size and position of openings 171A formed in the material layers 110, 104 on the basis of an appropriate etch sequence 170. For instance, if comprised of silicon and silicon dioxide, respectively, well-established plasma-assisted etch recipes may be applied. In other cases, other etch recipes may be used, depending on the characteristics of the materials of the layers 110, 104. Thereafter, the etch mask 171 may be removed, for instance, by plasma-assisted or wet chemical removal processes. Consequently, the openings 171A may represent portions of optical waveguide branches, which may receive an appropriate material, such as a silicon material, so as to optically connect to the layer 103, wherein the cladding material 155E may provide the required optical confinement. As previously explained, due to the substantially perpendicular orientation of an optical axis 155F of the layer 103, which may represent a buried waveguide portion, as previously explained, and an optical axis 155G of a substantially vertical waveguide branch, typically, the deflection areas 156A, 156B may have to be provided. It should be appreciated in this respect that an optical axis of a waveguide is to be understood as the general direction of propagation, wherein angles of propagation with respect to the optical axis are enclosed, which provide a sufficiently small angle of incidence with respect to a cladding material in order to provide total reflectivity. That is, a light beam propagating generally along the optical axis at relatively small angles may be totally reflected when impinging the interface formed by the optical denser core material and the optical thinner cladding material, as previously explained. However, at extremely small radii of curvature, as may be the case when a vertical waveguide branch couples to a horizontal waveguide branch, a significant portion of light energy may be lost, without providing an appropriate reflecting area, such as a mirror-like area, a Bragg grating and the like.

Figure 1K:
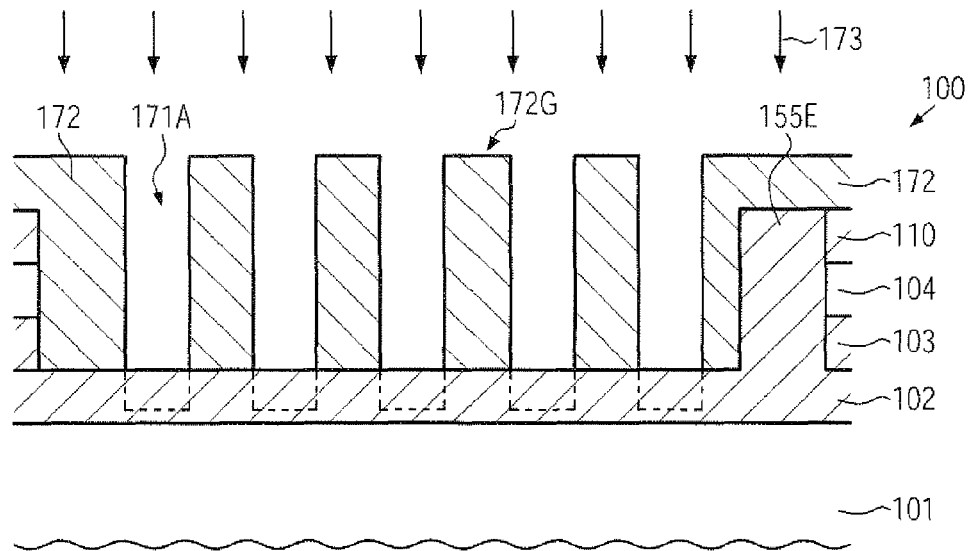
FIGS. 1k-1l schematically illustrate cross-sectional views of the integrated circuit device when forming a Bragg grating as a deflecting area in the optical waveguide, according to still further illustrative embodiments.

FIG. 1k schematically illustrates the device 100 according to illustrative embodiments in which the opening 171A may be formed so as to extend down to the buried insulating material 102 so as to provide a Bragg grating for efficiently deflecting light rays in the waveguide still to be formed. For convenience, in FIG. 1K, only one of the openings 171A is illustrated. Furthermore, the opening 171A may comprise an etch mask 172, which may define a pattern or a grating 172G, which may be transferred into the material 102 on the basis of an appropriate etch process 173. The etch mask 172 may be formed on the basis of any appropriate material, such as polymer materials, resist materials and the like, which may be deposited so as to completely fill the opening 171A and also form a desired material layer above horizontal portions of the semiconductor layer 110. Thereafter, an appropriate lithography process may be performed and the mask material may be patterned in order to obtain the grating 172G. Thereafter, the etch process 173 may be performed on the basis of any appropriate plasma-assisted etch recipe in order to etch into the buried insulating layer 102.

Figure 1L:
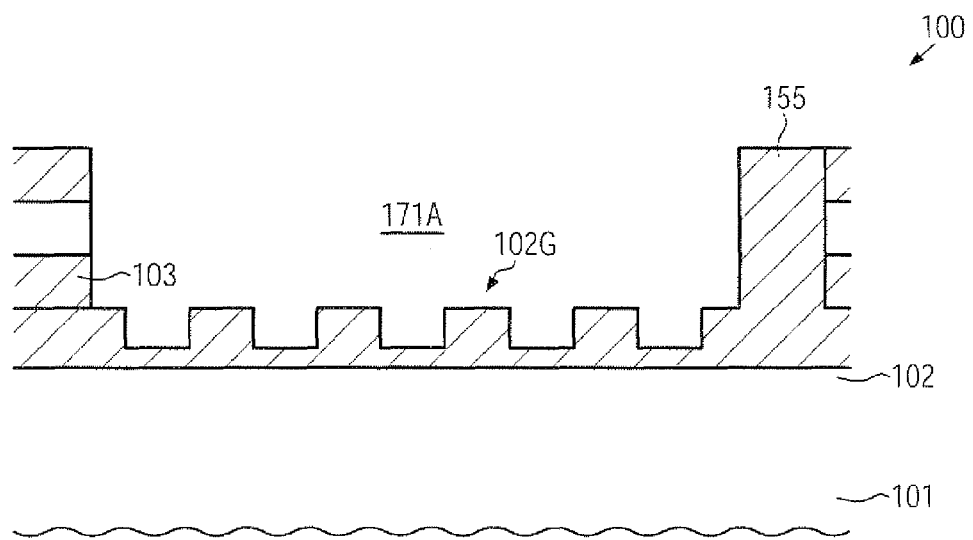

FIG. 1l schematically illustrates the device 100 in a further advanced manufacturing stage, i.e., after the removal of the etch mask 172 of FIG. 1k. Thus, a grating 102G may be formed in the buried insulating layer 102, wherein the characteristics of the grating 102G may be appropriately selected so as to obtain the desired deflective behavior in combination with a further core material, such as silicon, to be filled into the opening 171A in a further advanced manufacturing stage.

Figure 1M:
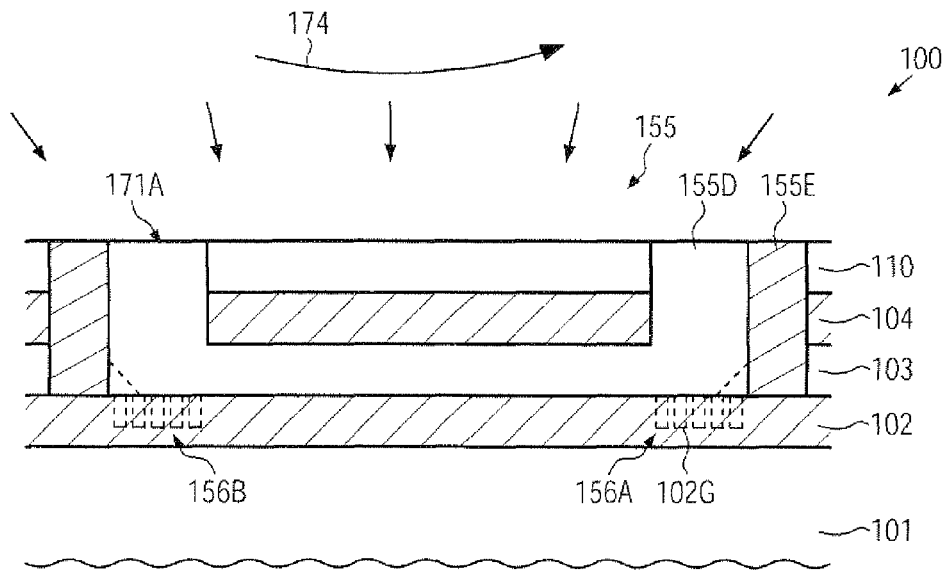
FIGS. 1m-1p schematically illustrate cross-sectional views of the integrated circuit device during further advanced manufacturing stages in forming an optical waveguide for device internal optical communication of circuit elements and circuit portions, according to illustrative embodiments.

FIG. 1m schematically illustrates the device 100 during a process sequence 174 for filling in the core material into the opening 171A and possibly into the grating 102G and for removing any excess material, for instance by a polishing process and the like. Consequently, the core material 155D, for instance in the form of silicon, may be formed adjacent to a portion of the cladding material 155E. Furthermore, the silicon material may also be filled into the grating 102G, if provided, thereby forming a Bragg grating, which may be used as the deflection areas 156A, 156B.

Figure 1N:
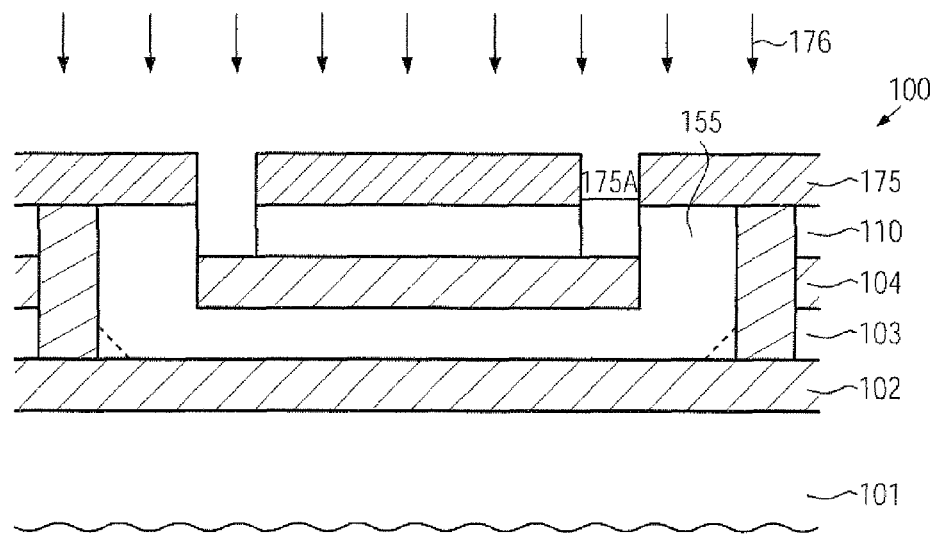

FIG. 1n schematically illustrates the device 100 in a further advanced manufacturing stage in which an etch mask 175 may be provided so as to define the lateral position and size of openings 175A to be formed at least in the semiconductor layer 110 in order to provide a further portion of a cladding material for the waveguide 155. For this purpose, appropriate lithography techniques in combination with an anisotropic etch process 176 may be applied in order to etch through the layer 110, while using the buried insulating layer 104 as an etch stop material.

Figure 1O:
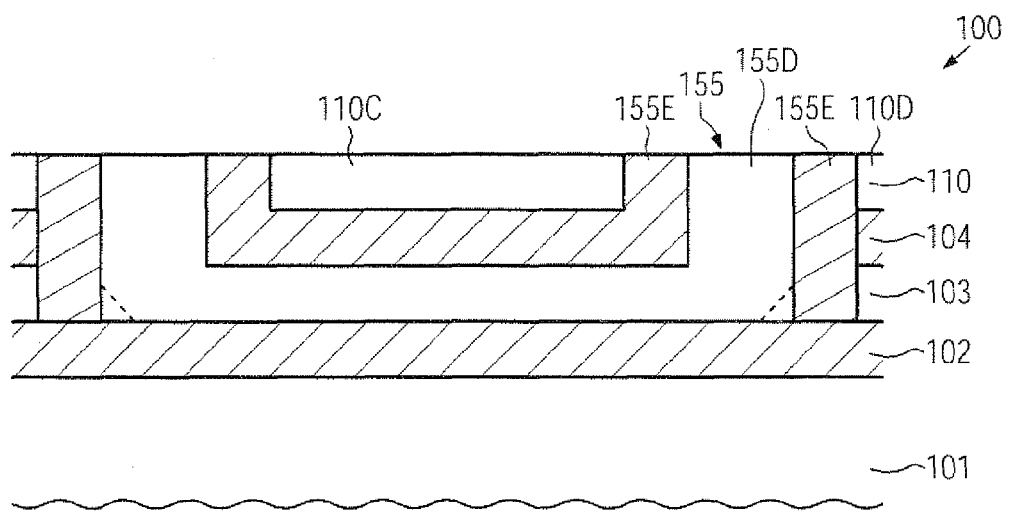

FIG. 1o schematically illustrates the device 100 in a manufacturing stage in which the cladding material 155E may completely enclose the core material 155D, which may be comprised of the silicon material previously deposited and a portion of the semiconductor layer 103. It should be appreciated that the process sequence for forming the openings 175A (FIG. 1n) and the subsequent deposition of the cladding material 155E, in some illustrative embodiments, may be combined with the formation of isolation structures, such as shallow trench isolations, in which the semiconductor layer 110 may be divided into a plurality of semiconductor regions, for instance in areas 110C, 110D, so that corresponding circuit elements may be formed on the basis of the appropriately defined semiconductor regions in these areas. Consequently, well-established process techniques may be applied in order to fill in the cladding material 155E, possibly in combination with an isolation material, and to remove any excess material based on CMP techniques and etch processes. Consequently, the device 100 as illustrated in FIG. 1o may be used as a start material for forming the circuit elements in and above the semiconductor layer 110, i.e., in the areas 110C, 110D, in accordance with well-established process techniques. On the other hand, the waveguide 155 may be provided with the desired optical characteristics and spatial configuration, wherein, as previously explained with reference to FIGS. 1a-1c, additional waveguide sections may be provided, for instance, by increasing the vertical portions of the waveguide 155, if required.

Figure 1P:
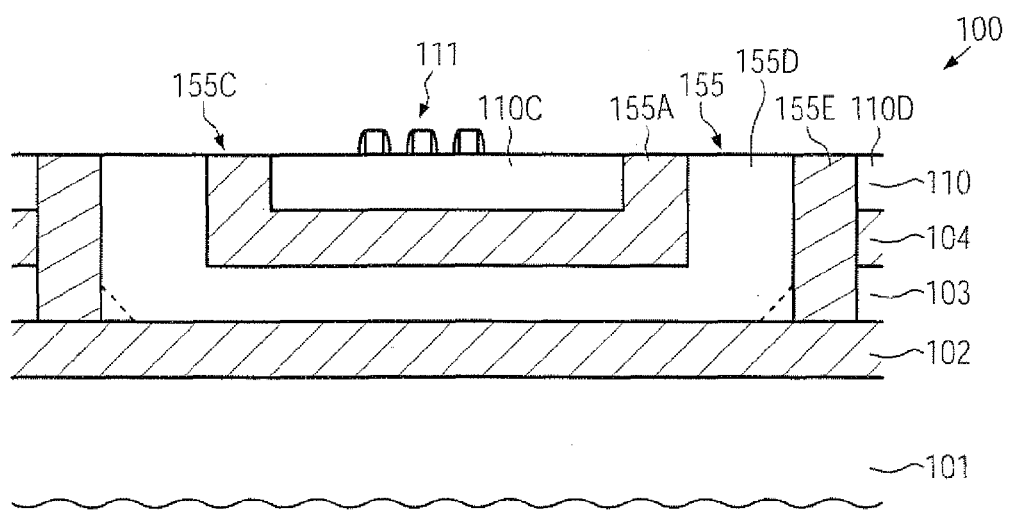

FIG. 1p schematically illustrates the integrated circuit device 100 with the plurality of circuit elements 111 formed in and above the semiconductor layer 110, wherein these circuit elements may represent a portion of a microprocessor, or any other complex analog and/or digital circuit, in which the provision of the optical communication capability by means of the waveguide 155 may provide superior thermal conditions, signal processing efficiency and the like, as previously discussed. Thereafter, the further processing may be continued, for instance, by forming a contact level, i.e., by depositing a dielectric material and forming therein corresponding contact elements, as previously illustrated with reference to FIG. 1a, wherein, as discussed above, opto-electronic components may also be provided so as to connect to at least one end of the waveguide 155. For instance, if appropriate material systems may be available in the device 100 in the manufacturing stage shown, appropriate devices, such as light sensitive diodes and the like, may be integrated into the layer 110 and may be optically connected to the waveguide 155, while the electrical connection to one or more of the circuit elements 111 may be accomplished via interconnect structures in, below or above the semiconductor layer 110. Thereafter, further processing may be continued by forming a metallization system, such as the metallization system 130 of FIG. 1a, by depositing a dielectric material and patterning the same in order to form vias and trenches, which are subsequently to be filled with an appropriate metal. As previously discussed, if a continuation of one or more of the branches 155A, 155C may be required, a corresponding opening may be formed in the dielectric material and may be filled with the cladding material 155E and the core material 155D. In other cases, a plurality of metallization layers or substantially the entire metallization system may be provided and subsequently a patterning process may be performed so as to etch through the resulting material system in order to connect to one of the branches 155A, 155C as required. Thereafter, the cladding material may be deposited and may be anisotropically etched so as to expose the underlying core material 155D. As a next step, the core material for the newly added branch may be filled in, wherein similar process techniques may be applied, as previously explained with reference to FIGS. 1d-1o. Consequently, the vertical extension of the waveguide 155, i.e., of the branches 155A, 155C as shown in FIG. 1P, may be individually adjusted in accordance with device requirements. Thereafter, any further opto-electronic component may be provided, for instance, by attaching a corresponding component to the device 100, which may be accomplished by using wafer bond techniques and the like. For example, the opto-electronic components may be formed on separate substrates and may be bonded to the device 100 or a plurality of identical devices 100, as previously explained. In other embodiments, one or more opto-electronic components may be added after separating individual devices 100 and prior to providing a package for the device 100.

As a result, the present disclosure provides integrated circuit devices, methods for forming the same and techniques for operating these devices wherein device internal optical signal transfer capabilities may be implemented in order to increase the overall performance of the integrated circuit device in terms of signal processing speed, while at the same time the thermal conditions may be maintained at a less critical level. Furthermore, circuit elements or circuit portions of different potential may be readily operatively connected to each other by the optical communication system, thereby further reducing the overall device complexity, for instance, in terms of voltage adaptations, stages and the like. The optical communication system may be provided in the form of an optical waveguide in combination with opto-electronic components, which may be provided as separate semiconductor devices attached to one or more semiconductor chips prior to incorporating the one or more semiconductor chips into a single package so as to form the finished integrated circuit device. Furthermore, an efficient signal exchange may be established within a complex three-dimensional chip configuration, thereby avoiding or at least reducing the number of required electrical through-hole vias, which may result in enhanced overall design flexibility and less critical thermal conditions. Furthermore, in some illustrative embodiments, the optical communication system of integrated circuit devices may further be configured to enable optical communication with the periphery, for instance, by extending the optical waveguide so as to allow optical signal exchange through the package of the integrated circuit device. In this case, superior connectivity to the peripheral components in complex systems may be accomplished, since the device internal optical communication system, or a chip-internal optical communication system, may allow high data rates with peripheral optical components, wherein even a "wireless" communication path may be established.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An integrated circuit device, comprising:
   a metallization system comprised of a plurality of metal lines;
   a first plurality of circuit elements formed in and above a first semiconductor region, said first plurality of circuit elements being electrically coupled to said metallization system;
   a second plurality of circuit elements formed in and above a second semiconductor region, said second plurality of circuit elements being electrically coupled to said metallization system;
   an optical wave guide having a first end and a second end;
   a first opto-electronic component electrically coupled to said first plurality of circuit elements via said metallization system so as to electrically communicate with at least one circuit element of said first plurality of circuit elements, said first opto-electronic component being optically coupled to said first end of said optical wave guide; and
   a second opto-electronic component electrically coupled to said second plurality of circuit elements via said metallization system so as to electrically communicate with at least one circuit element of said second plurality of circuit elements, said second opto-electronic component being optically coupled to said second end of said optical wave guide, said optical waveguide being adapted to transmit an optical signal between said first and second opto-electronic components while circumventing said metallization system.

2. The integrated circuit device of claim 1, wherein said first and second semiconductor regions are formed in a common semiconductor layer.

3. The integrated circuit device of claim 1, wherein said first and second semiconductor regions are provided as a stacked configuration.

4. The integrated circuit device of claim 2, wherein said metallization system comprises one or more metallization layers and wherein at least one of said first and second opto-electronic components is formed above one or more metallization layers of said metallization system.

5. The integrated circuit device of claim 2, wherein said metallization system is formed above at least one of said first and second opto-electronic components.

6. The integrated circuit device of claim 1, further comprising a first wave guide branch extending along a depth direction of said first and second semiconductor regions and connecting said first opto-electronic component to said first end of said optical wave guide.

7. The integrated circuit device of claim 6, further comprising a second wave guide branch extending along a lateral direction and connecting to said first wave guide branch.

8. The integrated circuit device of claim 1, wherein at least one of said first and second pluralities of circuit elements forms a portion of a central processing unit (CPU).

9. The integrated circuit device of claim 1, wherein said optical wave guide comprises a core formed of a semiconductor material and a cladding comprising a dielectric material.

10. The integrated circuit device of claim 9, wherein said semiconductor material and said dielectric material comprise silicon.

11. The integrated circuit device of claim 9, wherein a first portion of said cladding is a portion of a buried dielectric layer formed below said semiconductor material.

12. The integrated circuit device of claim 11, wherein a second portion of said cladding is a portion of a buried layer formed below said semiconductor layer.

13. The integrated circuit device of claim 7, wherein said optical wave guide comprises at least one deflecting area configured to optically couple said first wave guide branch with said second wave guide branch.

14. The integrated circuit device of claim 13, wherein said deflecting area comprises a Bragg grating.

15. The integrated circuit device of claim 13, wherein said deflecting area comprises a mirror area comprising an interface formed between said core material and said cladding.

16. A method of operating an integrated circuit device, the method comprising:
generating a first electrical signal in a first circuit portion of said integrated circuit device;
transmitting said first electrical signal to a device internal first opto-electronic component via a metallization system;
converting said first electrical signal into an optical signal by using said device internal first opto-electronic component;
transmitting said optical signal in a device internal wave guide to a second device internal opto-electronic component;
converting said optical signal into a second electrical signal by using said second device internal opto-electronic component; and
transmitting said second electrical signal to a second circuit portion of said integrated circuit via said metallization system.

17. The method of claim 16, wherein said first and second circuit portions are parts of a microprocessor.

18. The method of claim 16, wherein transmitting said optical signal comprises transmitting said optical signal within a single chip comprising said first and second circuit portions.

19. The method of claim 16, wherein transmitting said optical signal comprises transmitting said optical signal from a first chip comprising said first circuit portion to a second chip comprising said second circuit portion.

* * * * *